(12) United States Patent
Sadlo et al.

(10) Patent No.: US 12,719,417 B2
(45) Date of Patent: Aug. 25, 2026

(54) AMPLIFIER WITH TRANSISTOR VOLTAGE CONTROL

(71) Applicants: STMICROELECTRONICS INTERNATIONAL N.V., Geneva (CH); CENTRE NATIONAL DE LA RECHERCHE SCIENTIFIQUE, Paris (FR); INSTITUT POLYTECHNIQUE DE BORDEAUX, Talence (FR); UNIVERSITE DE BORDEAUX, Bordeaux (FR)

(72) Inventors: Sebastien Sadlo, Paris (FR); Nathalie Deltimple, Pessac (FR); Andreia Cathelin, Laval-en-Belledonne (FR)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 429 days.

(21) Appl. No.: 18/240,091

(22) Filed: Aug. 30, 2023

(65) Prior Publication Data

US 2025/0080060 A1 Mar. 6, 2025

(51) Int. Cl.
*H03F 3/04* (2006.01)
*H03F 1/56* (2006.01)

(52) U.S. Cl.
CPC ............... *H03F 3/04* (2013.01); *H03F 1/565* (2013.01); *H03F 2200/222* (2013.01); *H03F 2200/387* (2013.01)

(58) Field of Classification Search
CPC ...... H03F 3/04; H03F 1/565; H03F 2200/222; H03F 2200/387; H03F 2200/408; H03F 1/0261; H03F 3/195; H03F 2200/294; H03F 3/193; H03F 3/245; H03F 2200/451
USPC ................................ 330/291, 310, 133, 150
See application file for complete search history.

(56) References Cited

U.S. PATENT DOCUMENTS 6,218,892 B1 * 4/2001 Soumyanath ........ H10D 84/859 257/E29.064
2016/0173036 A1 6/2016 Vogt et al.
2017/0133989 A1 5/2017 Dytkstra et al.
2018/0183440 A1 6/2018 Jensen et al.
2019/0288646 A1 9/2019 Lee et al.
2021/0396795 A1 * 12/2021 Jennings ................ H03F 3/211

* cited by examiner

*Primary Examiner* — Hieu P Nguyen
(74) *Attorney, Agent, or Firm* — Alston & Bird LLP

(57) ABSTRACT

An amplifier including a first amplification stage unit that includes a first transistor configured to modulate a first transistor threshold voltage using a first control voltage on a body of the first transistor, and a first direct current permitting feedback loop electrically coupling a drain of the first transistor with a gate of the first transistor. The amplifier may include a second amplification stage unit that includes a second transistor configured to modulate a second transistor threshold voltage using a second control voltage on a body of the second transistor, and a second direct current permitting feedback loop electrically coupling a drain of the second transistor with a gate of the second transistor.

18 Claims, 10 Drawing Sheets

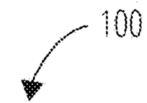
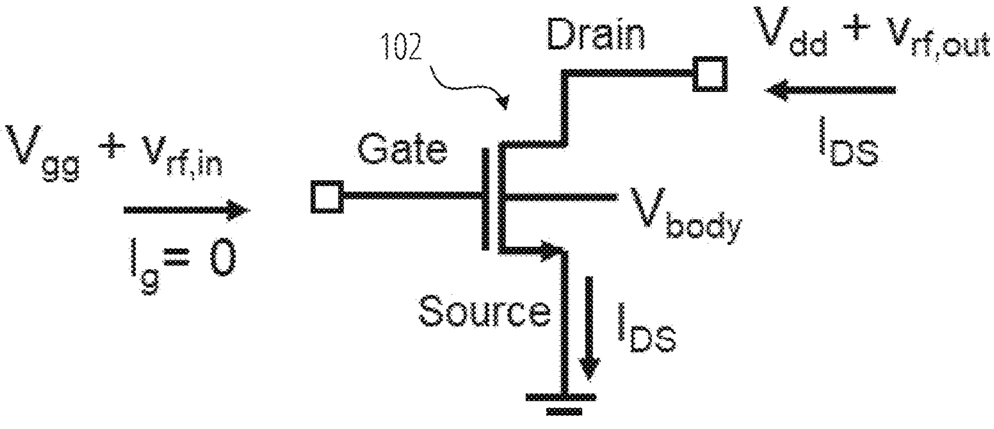
FIG. 1

ELECTRICALLY COUPLING AND MATCH, BY A FIRST DC PERMITTING MATCHING CIRCUIT, THE FIRST AMPLIFICATION STAGE UNIT TO THE SECOND AMPLIFICATION STAGE UNIT 602

PROVIDE AN AMPLIFIER DC BIAS VOLTAGE TO THE FIRST AMPLIFICATION STAGE UNIT AND TRANSMITTING THE AMPLIFIER DC BIAS VOLTAGE TO THE SECOND AMPLIFICATION STAGE UNIT USING THE FIRST DC PERMITTING MATCHING CIRCUIT 604

PROVIDE THE AMPLIFIER DC BIAS VOLTAGE TO THE SECOND AMPLIFICATION STAGE UNIT AND TRANSMITTING THE AMPLIFIER DC BIAS VOLTAGE TO THE FIRST AMPLIFICATION STAGE UNIT USING THE FIRST DC PERMITTING MATCHING CIRCUIT 608

PROVIDE FUNCTIONING BIAS FOR BOTH THE FIRST AMPLIFICATION STAGE UNIT AND THE SECOND AMPLIFICATION STAGE UNIT 606

FIG. 6

ELECTRICALLY COUPLE AND MATCH, BY A FIRST DC PERMITTING MATCHING CIRCUIT, THE FIRST AMPLIFICATION STAGE UNIT TO THE SECOND AMPLIFICATION STAGE UNIT 702

CONTROL THE FIRST CONTROL VOLTAGE INDEPENDENTLY FROM THE SECOND CONTROL VOLTAGE 704

CONTROL AT LEAST ONE OF THE GAIN, LINEARITY, AND POWER CONSUMPTION OF THE FIRST AMPLIFICATION STAGE UNIT USING THE FIRST CONTROL VOLTAGE DURING THE OPERATION OF THE AMPLIFIER 706

CONTROL AT LEAST ONE OF THE GAIN, LINEARITY, AND POWER CONSUMPTION OF THE SECOND AMPLIFICATION STAGE UNIT USING THE SECOND CONTROL VOLTAGE DURING THE OPERATION OF THE AMPLIFIER INDEPENDENT OF THE GAIN, LINEARITY, AND POWER CONSUMPTION OF THE FIRST AMPLIFICATION STAGE UNIT 708

ELECTRICALLY COUPLE AND MATCH AN INPUT OF THE AMPLIFIER TO THE FIRST AMPLIFICATION STAGE UNIT USING INPUT MATCHING CIRCUIT 710

ELECTRICALLY COUPLE AND MATCH THE $N^{TH}$ AMPLIFICATION STAGE UNIT TO A LOAD OF THE AMPLIFIER USING OUTPUT MATCHING CIRCUIT 712

FIG. 7

CONTROL AT LEAST ONE OF THE GAIN, LINEARITY, AND POWER CONSUMPTION OF THE AMPLIFIER USING ANY OF THE FIRST CONTROL VOLTAGE OR THE SECOND CONTROL VOLTAGE OR ANY COMBINATION OF THE FIRST CONTROL VOLTAGE AND THE SECOND CONTROL VOLTAGE WHILE AN AMPLIFIER DC BIAS VOLTAGE REMAINS APPROXIMATELY CONSTANT 802

VARY ANY OF THE FIRST CONTROL VOLTAGE OR THE SECOND CONTROL VOLTAGE DURING AN OPERATION OF THE AMPLIFIER 804

DETERMINE A VARIABLE GAIN, LINEARITY, OR POWER CONSUMPTION OF THE AMPLIFIER USING THE VARIABLE FIRST CONTROL VOLTAGE OR THE VARIABLE SECOND CONTROL VOLTAGE OR A COMBINATION OF THE VARIABLE FIRST CONTROL VOLTAGE OR THE VARIABLE SECOND CONTROL VOLTAGE 806

FIG. 8

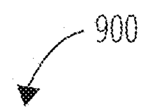

MODULATE, BY AN $N^{TH}$ TRANSISTOR OF AN $N^{TH}$ AMPLIFICATION STAGE UNIT, AN $N^{TH}$ TRANSISTOR THRESHOLD USING AN $N^{TH}$ CONTROL VOLTAGE ON A BODY OF THE $N^{TH}$ TRANSISTOR 910

ELECTRICALLY COUPLE A DRAIN OF THE $N^{TH}$ TRANSISTOR WITH A GATE OF THE $N^{TH}$ TRANSISTOR 912

ELECTRICALLY COUPLE AND MATCH, BY AN $(N-1)^{TH}$ DC PERMITTING MATCHING CIRCUIT, AN $(N-1)^{TH}$ AMPLIFICATION STAGE UNIT TO THE $N^{TH}$ AMPLIFICATION STAGE UNIT 914

FIG. 9

AMPLIFIER WITH TRANSISTOR VOLTAGE CONTROL

Example embodiments of the present disclosure relate generally to the field of amplifiers and in particular amplifiers using various amplification stage units.

BACKGROUND

Amplifiers are used in electronic circuits such as in communication circuits, transceivers, etc. Amplifiers may require to operate at high frequencies. Applicant has identified many technical challenges and difficulties associated with amplifiers for example at high operation frequencies. Through applied effort, ingenuity, and innovation, Applicant has solved problems related to amplifiers, which are described in detail below.

BRIEF SUMMARY

An amplifier is provided in accordance with various embodiments of the present disclosure. In one aspect, the amplifier includes a first amplification stage unit that includes a first transistor configured to modulate a first transistor threshold voltage using a first control voltage on a body of the first transistor, and a first direct current permitting feedback loop electrically coupling a drain of the first transistor with a gate of the first transistor. The amplifier also includes a second amplification stage unit that includes a second transistor configured to modulate a second transistor threshold voltage using a second control voltage on a body of the second transistor, and a second direct current permitting feedback loop electrically coupling a drain of the second transistor with a gate of the second transistor. At least one of a gain, linearity, and power consumption of the first or second amplification stage units may be a function of the corresponding first or second transistor threshold voltage.

The amplifier may also include a first direct current permitting matching circuit configured to electrically couple and match the first amplification stage unit to the second amplification stage unit. The first and second transistors may be fully depleted silicon on insulator (FD-SOI) transistors.

The amplifier may be configured to control at least one of the gain, linearity, and power consumption of the first amplification stage unit using the first control voltage during the operation of the amplifier.

The amplifier may be configured to control at least one of the gain, linearity, and power consumption of the amplifier using any of the first control voltage or the second control voltage or any combination of the first control voltage and the second control voltage while an amplifier bias voltage remains approximately constant.

The amplifier may also include at least a third amplification stage unit including a third transistor configured to modulate a third transistor threshold voltage using a third control voltage on a body of the third transistor, and a third direct current permitting feedback loop electrically coupling a drain of the third transistor with a gate of the third transistor. The amplifier may also include a second direct current permitting matching circuit configured to electrically couple and match the first amplification stage unit to the second amplification stage unit.

The amplifier may also be configured to provide an amplifier bias voltage to the first amplification stage unit and transmit the amplifier bias voltage to the second amplification stage unit using the first direct current permitting matching circuit, or provide the amplifier bias voltage to the second amplification stage unit and transmit the amplifier bias voltage to the first amplification stage unit using the first direct current permitting matching circuit, where the amplifier bias voltage provides functioning bias for both the first amplification stage unit and the second amplification stage unit.

The amplifier may also be configured to control the first control voltage independently from the second control voltage, and control at least one of the gain, linearity, and power consumption of the second amplification stage unit using the second control voltage during the operation of the amplifier independent of the gain, linearity, and power consumption of the first amplification stage unit.

The amplifier may also be configured to vary any of the first control voltage or the second control voltage during an operation of the amplifier, and determine a variable gain, linearity, or power consumption of the amplifier using the variable first control voltage or the variable second control voltage or a combination of the variable first control voltage or the variable second control voltage.

The amplifier may also be configured to provide an amplifier bias voltage to the first amplification stage unit and transmit the amplifier bias voltage to the second amplification stage unit using the first direct current permitting matching circuit and to the third amplification stage unit using the second direct current permitting matching circuit, or provide the amplifier bias voltage to the third amplification stage unit and transmit the amplifier bias voltage to the second amplification stage unit using the second direct current permitting matching circuit and to the first amplification stage unit using the first direct current permitting matching circuit, where the amplifier bias voltage provides functioning bias for the first amplification stage unit, the second amplification stage unit, and the third amplification stage unit.

The amplifier may be configured to control the first control voltage, the second control voltage and the third control voltage independently from each other, control at least one of the gain, linearity, and power consumption of any of the first amplification stage unit, the second amplification stage unit, or the third amplification stage unit independent of each other using the corresponding first control voltage, second control voltage, or the third control voltage, during the operation of the amplifier, and control at least one of the gain, linearity, and power consumption of the amplifier using any of the first control voltage, the second control voltage, or the third control voltage, or any combination of the first control voltage, the second control voltage, or the third control voltage while an amplifier bias voltage remains approximately constant.

The amplifier may be configured to vary any of the first control voltage, the second control voltage, or the third control voltage during an operation of the amplifier, and determine a variable gain, linearity, or power consumption of the amplifier using the variable first control voltage, the variable second control voltage, the variable third control voltage or a combination thereof.

In one aspect, a method includes modulating, by a first transistor of a first amplification stage unit, a first transistor threshold voltage using a first control voltage on a body of the first transistor, electrically coupling, by a first direct current permitting feedback loop, a drain of the first transistor with a gate of the first transistor, modulating, by a second transistor of a second amplification stage unit, a second transistor threshold voltage using a second control voltage on a body of the second transistor, and electrically coupling, by a second direct current permitting feedback loop, a drain of the second transistor with a gate of the second transistor.

The method may include electrically coupling and matching, by a first direct current permitting matching circuit, the first amplification stage unit to the second amplification stage unit.

The method may include controlling the first control voltage independently from the second control voltage, controlling at least one of the gain, linearity, and power consumption of the first amplification stage unit using the first control voltage during the operation of the amplifier, and controlling at least one of the gain, linearity, and power consumption of the second amplification stage unit using the second control voltage during the operation of the amplifier independent of the gain, linearity, and power consumption of the first amplification stage unit.

The method may include controlling at least one of the gain, linearity, and power consumption of the amplifier using any of the first control voltage or the second control voltage or any combination of the first control voltage and the second control voltage while an amplifier bias voltage remains approximately constant.

The method may include modulating, by a third transistor of a third amplification stage unit, a third transistor threshold voltage using a third control voltage on a body of the third transistor, electrically coupling a drain of the third transistor with a gate of the third transistor, and electrically coupling and matching, by a second direct current permitting matching circuit, the first amplification stage unit to the second amplification stage unit.

The method may include providing an amplifier bias voltage to the first amplification stage unit and transmitting the amplifier bias voltage to the second amplification stage unit using the first direct current permitting matching circuit, or providing the amplifier bias voltage to the second amplification stage unit and transmitting the amplifier bias voltage to the first amplification stage unit using the first direct current permitting matching circuit, where the amplifier bias voltage provides functioning bias for both the first amplification stage unit and the second amplification stage unit.

The method may include varying any of the first control voltage or the second control voltage during an operation of the amplifier, and determining a variable gain, linearity, or power consumption of the amplifier using the variable first control voltage or the variable second control voltage or a combination of the variable first control voltage or the variable second control voltage.

The method may include providing an amplifier bias voltage to the first amplification stage unit and transmit the amplifier bias voltage to the second amplification stage unit using the first direct current permitting matching circuit and to the third amplification stage unit using the second direct current permitting matching circuit, or providing the amplifier bias voltage to the third amplification stage unit and transmit the amplifier bias voltage to the second amplification stage unit using the second direct current permitting matching circuit and to the first amplification stage unit using the first direct current permitting matching circuit, where the amplifier bias voltage provides functioning bias for the first amplification stage unit, the second amplification stage unit, and the third amplification stage unit, controlling the first control voltage, the second control voltage and the third control voltage independently from each other, controlling at least one of the gain, linearity, and power consumption of any of the first amplification stage unit, the second amplification stage unit, or the third amplification stage unit independent of each other using the corresponding first control voltage, second control voltage, or the third control voltage, during the operation of the amplifier, controlling at least one of the gain, linearity, and power consumption of the amplifier using any of the first control voltage, the second control voltage, or the third control voltage, or any combination of the first control voltage, the second control voltage, or the third control voltage while an amplifier bias voltage remains approximately constant, varying any of the first control voltage, the second control voltage, or the third control voltage during an operation of the amplifier, and determining a variable gain, linearity, or power consumption of the amplifier using the variable first control voltage, the variable second control voltage, the variable third control voltage or a combination thereof.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will also be appreciated that the scope of the disclosure encompasses many potential embodiments in addition to those here summarized, some of which will be further described below. Other technical features may be readily apparent to one skilled in the art from the following FIGURES, descriptions, and claims.

BRIEF DESCRIPTION OF THE SEVERAL VIEWS OF THE DRAWINGS

The description of the illustrative embodiments may be read in conjunction with the accompanying FIGURES. It will be appreciated that, for simplicity and clarity of illustration, elements illustrated in the FIGURES have not necessarily been drawn to scale, unless described otherwise. For example, the dimensions of some of the elements may be exaggerated relative to other elements, unless described otherwise. Embodiments incorporating teachings of the present disclosure are shown and described with respect to the FIGURES presented herein, in which:

FIG. 1 is a schematic diagram illustrating a single stage common source amplifier.

FIG. 6 illustrates a routine 600 in accordance with various embodiments of the present disclosure.

FIG. 7 illustrates a routine 700 in accordance with various embodiments of the present disclosure.

FIG. 8 illustrates a routine 800 in accordance with various embodiments of the present disclosure.

FIG. 9 illustrates a routine 900 in accordance with various embodiments of the present disclosure.

DETAILED DESCRIPTION

Figure 2:
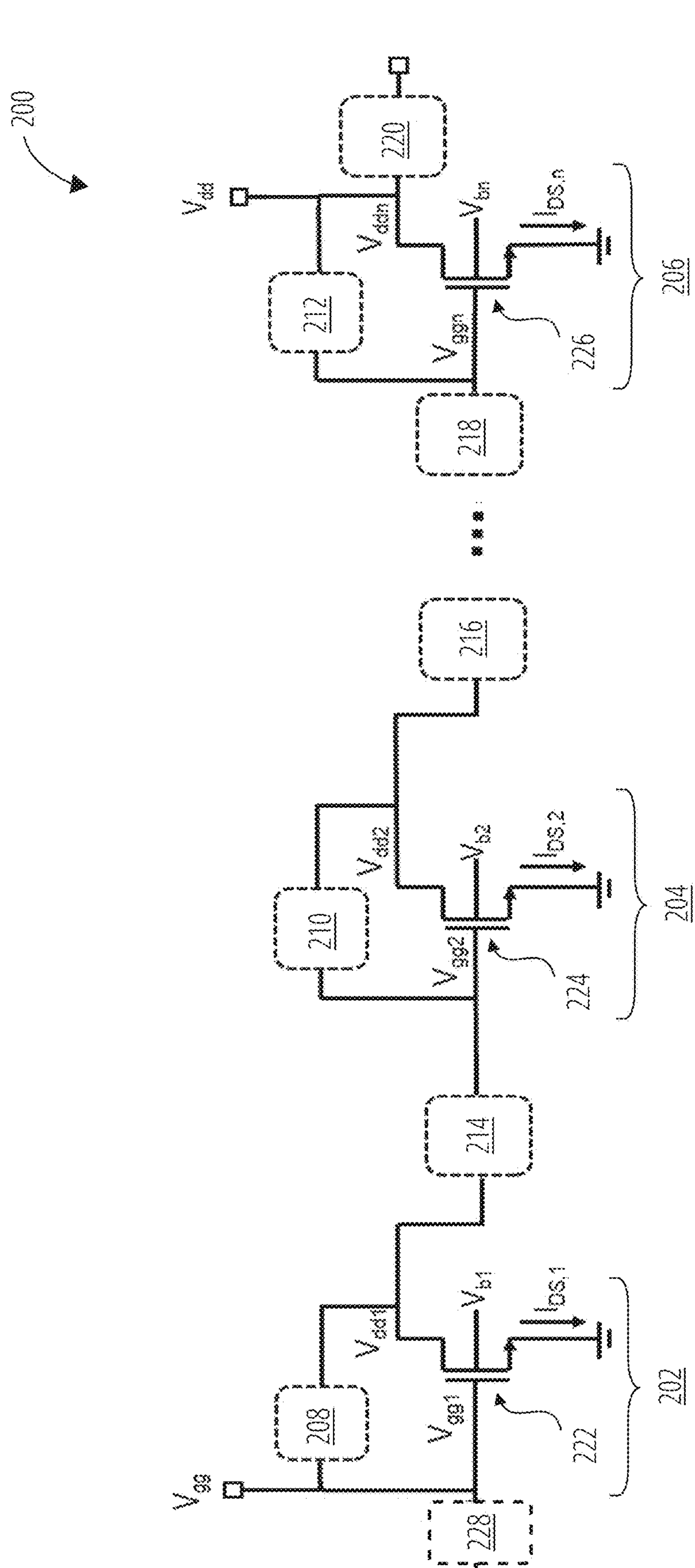
FIG. 2 is a schematic diagram illustrating an amplifier in accordance with various embodiments of the present disclosure.

Some embodiments of the present disclosure will now be described more fully hereinafter with reference to the accompanying drawings, in which some, but not all embodiments of the disclosure are shown. Indeed, these disclosures may be embodied in many different forms and should not be construed as limited to the embodiments set forth herein; rather, these embodiments are provided so that this disclosure will satisfy applicable legal requirements. Like numbers refer to like elements throughout.

The components illustrated in the FIGURES represent components that may or may not be present in various embodiments of the present disclosure described herein such that embodiments may include fewer or more components than those shown in the FIGURES while not departing from the scope of the present disclosure. Some components/aspects may be omitted from one or more figures or shown in dashed line for visibility, clarity, and/or illustrative purposes, for example for visibility of the underlying components.

The phrases "in an example embodiment," "some embodiments," "various embodiments," and the like generally mean that the particular feature, structure, or characteristic following the phrase may be included in at least one embodiment of the present disclosure, and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such components or features may be optionally included in some embodiments, or may be excluded.

The terms "electrically coupled" in the present disclosure refer to two or more electrical elements and/or electric circuit(s) being connected through wired means (for example but not limited to, conductive wires or traces) and/or wireless means (for example but not limited to, wireless network, electromagnetic field), such that data and/or information (for example, electronic indications, signals) may be transmitted to and/or received from the electrical elements and/or electric circuit(s) that are electrically coupled.

Various electrical devices include signal amplifiers. For example, a high frequency communications circuit may require an amplifier at the transmission and/or reception stages. For example, the transmitter, receiver, and/or transceiver modules in cellular communications devices such as 5G or 6G devices may require variable gain amplifiers (VGAs) to regulate and/or amplify the received or transmitted signal. The VGAs may need to be calibrated after fabrication and/or be dynamically modified during its operation to provide various gain or other operation values.

Referring now to FIG. 1, a schematic diagram illustrating a single stage amplifier 100 is provided. In various examples, the single stage amplifier 100 is a common source amplifier. The transistor 102 may be biased using any of the Direct Current (DC) components of the drain voltage ($V_{dd}$) used as the bias voltage, or the DC component of the gate voltage ($V_{gg}$) used as the bias voltage. An input Radio Frequency (RF) signal $v_{rf,in}$ may be added to the bias voltage $V_{gg}$ of the gate of the transistor 102. The $v_{rf,in}$ may be amplified by the single stage amplifier 100 and produce the output RF signal $v_{rf,out}$ which may be collected at the drain of the transistor 102.

A DC current $I_{DS}$ may flow from the drain to the source of transistor 102 and to a ground node with an assumption that the current $I_g$ flowing to the gate of transistor 102 is approximately zero. The $I_{DS}$ value may determine any of the gain, linearity, and/or power consumption of the single stage amplifier 100.

The $I_{DS}$ may be a function of the dimensions of the transistor 102 such as width (W) and length (L), the biasing voltages $V_{dd}$, $V_{gg}$ and technological parameters such as a threshold voltage $V_t$ of the transistor. The $V_t$ may be the minimum gate-to-source voltage ($V_{gs}$ or $V_{gg}$ when the source is electrically coupled to the ground such as in a common source amplifier) that is needed to create a conducting path between the source and drain terminals.

The function determining $I_{DS}$ based on the parameters described above may be described as follows:

$$I_{DS} = f\left(\frac{W}{L}, V_{dd}, (V_{gg} - V_t)\right) \quad \text{Eq. 1}$$

In various embodiments of the present disclosures, the transistor 102 may be a fully depleted silicon on insulator (FD-SOI) transistor as for example described in U.S. Pat. No. 9,455,689 B2 and U.S. Pat. No. 10,134,894 B2, disclosures of which are incorporated herein by reference in their entireties.

A FD-SOI transistor may be configured to have a biasing voltage $V_{body}$ applied to the body of the transistor. The $V_{body}$ may modify the $V_t$ of the transistor. Hence, in a FD-SOI transistor, the $V_t$ is a function of the $V_{body}$ as follows:

$$V_t = f(V_{body}) \quad \text{Eq. 2}$$

Referring to Eq. 1, by varying the $V_{body}$ in a FD-SOI transistor, the threshold voltage $V_t$ of the transistor, consequently the $I_{DS}$, and therefore any of the gain, linearity, and/or power consumption of the amplifier may be modified.

In various embodiments, successive amplification stage units are used to increase a total gain of an amplifier. Referring now to FIG. 2, a schematic diagram illustrating an amplifier 200 is provided in accordance with various embodiments of the present disclosure. In various embodiments, the amplifier 200 may include two or more of amplification stage units. For example, amplifier 200 may include first amplification stage unit 202, second amplification stage unit 204, and/or the $n^{th}$ amplification stage unit 206, where $n \geq 2$.

In various embodiments, each amplification stage unit includes a transistor. For example, the first amplification stage unit 202 may include a first transistor 222, the second amplification stage unit 204 may include a second transistor 224, and the $n^{th}$ amplification stage unit 206 may include an $n^{th}$ transistor 226. Each transistor may be configured to modulate the threshold voltage of the transistor using a control voltage applied to the body of the transistor. For example, the first transistor 222 is configured to modulate the first transistor threshold voltage using a first control voltage on the body of the first transistor ($V_{b1}$), the second transistor 224 is configured to modulate the second transistor threshold voltage using a second control voltage on the body of the second transistor ($V_{b2}$), and the $n^{th}$ transistor 226 is configured to modulate the $n^{th}$ transistor threshold voltage using an $n^{th}$ control voltage on the body of the $n^{th}$ transistor ($V_{bn}$).

In example embodiments, the transistors are FD-SOI transistors.

In various embodiments, at least one of a gain, linearity, and power consumption of an amplification stage unit is a function of the corresponding transistor threshold voltage. In various embodiments, the amplifier may therefore be configured to control at least one of the gain, linearity, and power consumption of each of the amplification stage units and/or at least one of the gain, linearity, and power consumption of each of the using the amplifier 200 using the one or more of the control voltages. In various embodiments, the gain, linearity, and power consumption of each of the amplification stage units and/or the amplifier 200 may be controlled during the operation of the amplifier 200 using one or more of the control voltages.

In various embodiments, the amplifier 200 may be configured to control the first control voltage on the body of the first transistor 222 ($V_{b1}$) independently from the second control voltage on the body of the second transistor 224 ($V_{b2}$) and/or from the $n^{th}$ control voltage on the body of $n^{th}$ transistor 226. Various control voltages on the bodies of the transistors may imply an independent current biasing for each transistor. The amplifier 200 may therefore be configured to control at least one of the gain, linearity, and power consumption of any of any of the amplification stage units independent from the other amplification stage units during the operation of the amplifier 200.

In various embodiments, the amplifier 200 may also be configured to vary any of the control voltages applied to each transistor during the operation of the amplifier 200, for example the control voltages may be time-variable. The amplifier 200 may therefore be configured to determine a variable (for example time-variable) gain, linearity, or power consumption of the amplifier 200 using the variable first, second, and/or $n^{th}$ control voltage or any combination thereof. In various embodiments, the gain, linearity, or power consumption of the amplifier 200 may be varied during the operation of the amplifier 200.

In various embodiments, each of the amplification stage units may be configured as a common source amplifier.

In various embodiments, each amplification stage unit may include a positive feedback loop. The positive feedback loop may electrically couple the drain to the gate of the transistor in each amplification stage unit. In example embodiments, the positive feedback loop increases a gain of the amplification stage unit.

In various embodiments, the feedback loops of the various amplification stage units are direct current (DC) permitting feedback loops. The DC permitting feedback loop may be configured to pass through a DC voltage.

For example, the first amplification stage unit 202 includes a first DC permitting feedback loop 208 configured to allow a DC voltage such as a bias voltage or a DC component of a bias voltage to be transmitted between a drain of the first transistor 222 and a gate of the first transistor 222. The second amplification stage unit 204 may include a second DC permitting feedback loop 210 electrically coupling a drain of the second transistor 224 with a gate of the second transistor 224, and the $n^{th}$ amplification stage unit 206 may include an $n^{th}$ DC permitting feedback loop 212 electrically coupling a drain of the $n^{th}$ transistor 226 with a gate of the $n^{th}$ transistor 226.

In various embodiments, the RF signal is amplified at each amplification stage unit and is transmitted to the next amplification stage unit. To increase an efficiency of power transfer between the amplification stage units, impedance matching circuits may be used between them. The matching circuits as used in various embodiments herein include impedance matching functions. In various embodiments, by providing DC permitting matching circuits between the amplification stage units, a DC voltage, such as a bias voltage may be transmitted from an amplification stage unit to a neighboring amplification stage unit.

For example, the amplifier 200 may include a first DC permitting matching circuit 214 configured to electrically couple and match the first amplification stage unit 202 to the second amplification stage unit 204. The amplifier 200 may include a second DC permitting matching circuit 216 configured to electrically couple and match the first amplification stage unit 202 to a third amplification stage unit (not shown). The amplifier 200 may include a $(n-1)^{th}$ DC permitting matching circuit 218 configured to electrically couple and match an $(n-1)^{th}$ amplification stage unit (not shown) to the $n^{th}$ amplification stage unit 206.

In various embodiments, the amplifier 200 includes an input matching circuit 228 configured to electrically couple and match an input of the amplifier 200 to the first amplification stage unit 202. The input matching circuit 228 may be DC permitting or DC blocking. The amplifier 200 may include output matching circuit 220 configured to electrically couple and match the $n^{th}$ amplification stage unit 206 to a load of amplifier 200. The output matching circuit 220 may be DC permitting or DC blocking.

In various embodiments, the DC bias voltage for the amplifier 200 is provided to the first amplification stage unit 202 (for example $V_{gg}$ provided to the gate of the first transistor 222). The amplifier DC bias voltage is transmitted to the other amplification stage units using the DC permitting feedback loops and/or the DC permitting matching circuits. For example, $V_{gg}$ may be transmitted to and provide bias for the second amplification stage unit 204 using the first DC permitting feedback loop 208 and the first DC permitting matching circuit 214. The $V_{gg}$ may also be transmitted to all the other amplification stage units using any intermediary DC permitting feedback loops and/or DC permitting matching circuits. In various embodiments, the amplifier DC bias voltage may be provided to the gate (e.g., $V_{gg1}$) or to the drain (e.g., $V_{dd1}$) of first transistor 222 and be transmitted to all the gates and/or drains of the other amplification stage units using any intermediary DC permitting feedback loops and/or DC permitting matching circuits and provide the appropriate biasing voltage for each amplification stage unit.

In various embodiments, the DC bias voltage for the amplifier 200 is provided to the last amplification stage unit of the amplifier 200, for example to the $n^{th}$ amplification stage unit 206. The amplifier DC bias voltage may for example be applied to the drain of the $n^{th}$ transistor 226 such as $V_{dd}$. The $V_{dd}$ may be transmitted to and provide functioning bias for the other amplification stage units using various DC permitting matching circuits and DC permitting feedback loops of amplifier 200. In various embodiments, the amplifier DC bias voltage may be provided to the gate (e.g., $V_{ggn}$) or to the drain (e.g., $V_{ddn}$) of $n^{th}$ transistor 226 and be transmitted to and provide functioning bias for the other amplification stage units using various DC permitting matching circuits and DC permitting feedback loops of amplifier 200.

In example embodiments, due to using DC permitting matching circuits between the amplification stage units, using DC permitting feedback loops in the amplification stage units, and due to the fact that the current flowing to the gate of a transistor may be approximately zero, the DC voltage of $V_{gg1}$, $V_{gg2}$, . . . , $V_{ggn}$ may be approximately equal, and the DC voltage of $V_{dd1}$, $V_{dd2}$, . . . , $V_{ddn}$ may be approximately equal.

In various embodiments, the bias voltage of the amplifier 200 may be provided (directly or indirectly) to the gate or drain of a transistor of any amplification stage unit of the amplifier, including any of the intermediary amplification stage units, and be transmitted to and provide bias voltage to other amplification stage units using any of the DC permitting feedback loops and/or DC permitting matching circuits.

Various embodiments of the present disclosure may therefore provide a single connection to a power supply for providing bias voltage to the amplifier 200. In example embodiments, doing so reduces cost, size, and/or complexity of the circuit by requiring less connections to power suppl (ies) throughout the amplifier circuit.

In various approaches that have been used, a bias voltage provided to each amplification stage unit may be varied in order to change a gain or other properties of the amplification stage unit. However, in various embodiments of the present disclosure, the control voltage applied to each transistor may be varied to independently change any of the gain, linearity, and/or power consumption of each amplification stage unit or the amplifier. This may be achieved while the bias voltage of amplifier remains constant.

For example, the amplifier 200 may be configured to control at least one of the gain, linearity, and/or power consumption of the amplification stage units or of the amplifier 200 using any of the first control voltage applied to first transistor 222, the second control voltage applied to second transistor 224, $n^{th}$ control voltages applied to $n^{th}$ transistor 226, or any combination of the control voltages while the amplifier DC bias voltage (such as $V_{gg}$ or $V_{dd}$) remains approximately constant.

Figure 3:
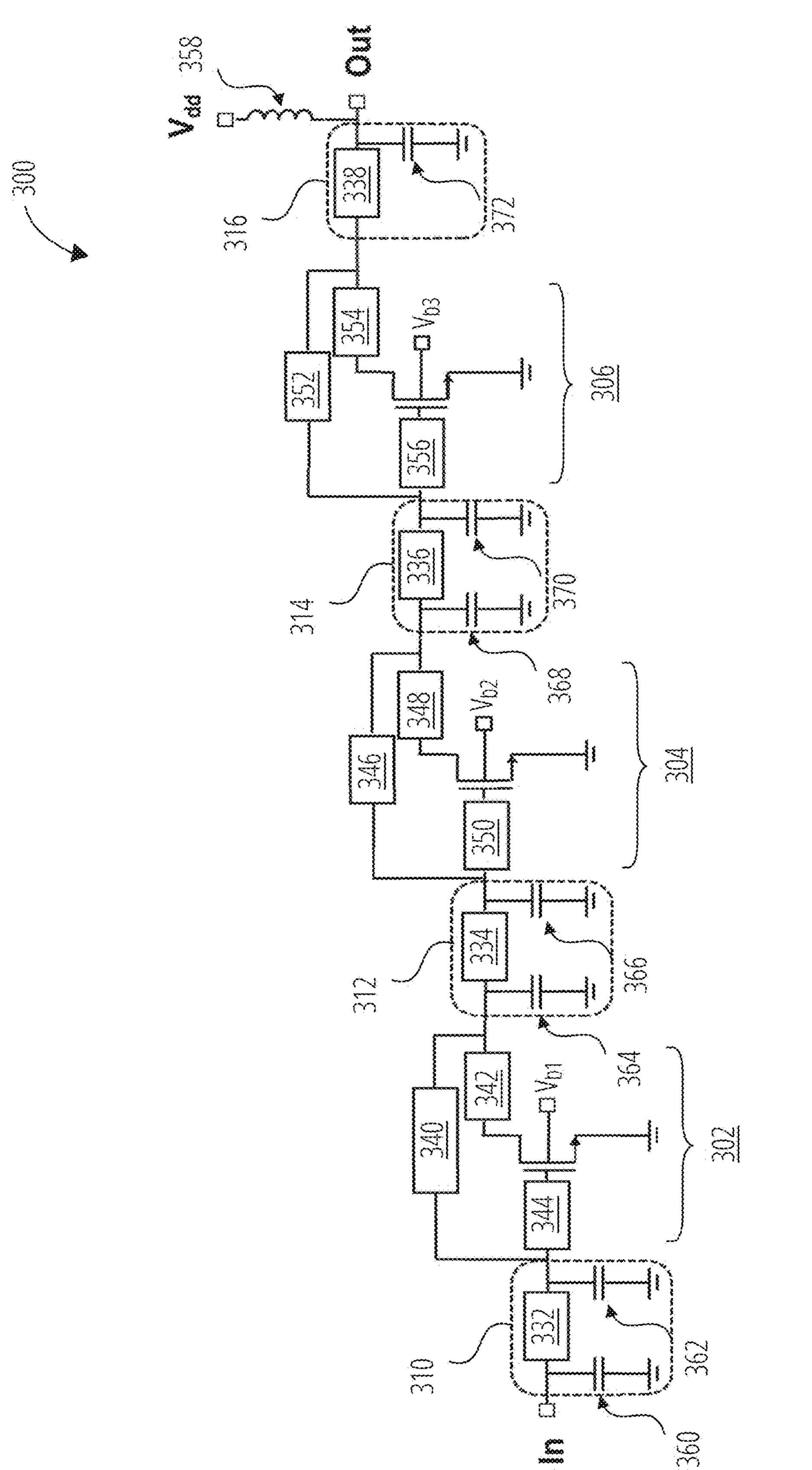
FIG. 3 is a schematic diagram illustrating an amplifier in accordance with example embodiments of the present disclosure.

Referring now to FIG. 3, a schematic diagram illustrating an amplifier 300 is provided in accordance with an example embodiment of the present disclosure. In various embodiments, the amplifier 300 includes first amplification stage unit 302 electrically coupled with the second amplification stage unit 304 using first DC permitting matching circuit 312. The amplifier 300 may also include third amplification stage unit 306 electrically coupled with the second amplification stage unit 304 using the second DC permitting matching circuit 314.

In various embodiments, the input of amplifier 300 may be electrically coupled with the first amplification stage unit 302 using input matching circuit 310 and the third amplification stage unit 306 may be electrically coupled with a load of the amplifier 300 using output matching circuit 316. In various embodiments, the input matching circuit 310 and/or output matching circuit 316 may be DC permitting or DC blocking matching circuits.

In various embodiments, first DC permitting matching circuit 312 and second DC permitting matching circuit 314 may each have a Π arrangement of a microstrip transmission line and capacitors. For example, the microstrip transmission line 334 may be electrically coupled with capacitors 364 and 366 on each end, and the microstrip transmission line 336 may be electrically coupled to capacitors 368 and 370 on each end. In various embodiments, the DC permitting matching circuits may have other arrangements of electrical components such as but not limited to a T arrangement of microstrip transmission lines coupled to a grounded capacitor. In various embodiments, instead of microstrip transmission lines, other types of transmission lines such as coplanar transmission lines may be used.

In example embodiments, the microstrips transmission lines may be 50Ω microstrips. In an example, microstrip transmission lines 332, 334 and 336 may be 120-160 μm long, for example approximately 140 μm long. In example embodiments, the microstrip transmission lines 340, 346, and 352 may be 150-200 μm long, for example approximately 178 μm long. In example embodiments, the microstrip transmission lines 342, 344, 348, 350, 354, 356 may be 10-15 μm long, for example approximately 13 μm long. In example embodiments, the microstrip transmission line 338 may be 100-140 μm long, for example approximately 120 μm long.

In example embodiments, capacitance values for capacitors 364 and 368 may be 50-100 fF, for example approximately 80 fF. In example embodiments, capacitance values for capacitors 366 and 370 may be 40-90 fF, for example approximately 60 fF. In example embodiments, capacitance values for capacitor 360 may be 10-50 fF, for example approximately 30 fF. In example embodiments, capacitance values for capacitor 362 may be 10-50 fF, for example approximately 23 fF. In example embodiments, capacitance values for capacitor 372 may be 5-30 fF, for example approximately 10 fF.

Various other configuration of circuits and component values, such as for amplification stage units, matching circuits and/or feedback loops and their components may be used.

Figures 4A, 4B:
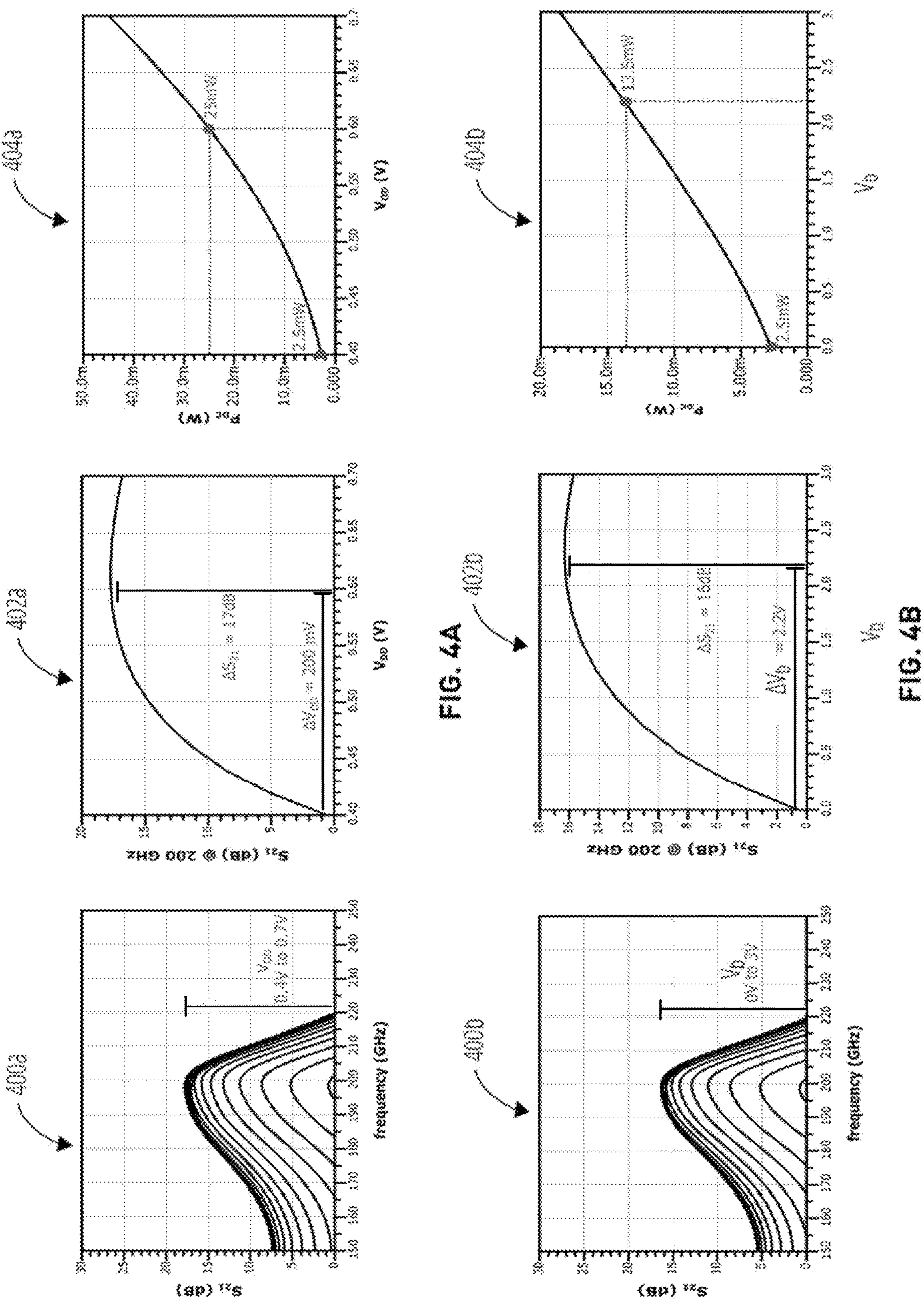
FIG. 4A illustrates diagrams in accordance with example embodiments of the present disclosure.
FIG. 4B illustrates diagrams in accordance with example embodiments of the present disclosure.

Referring now to FIG. 4A, various diagrams demonstrating various performance metrics of an amplifier are provided. In various applications of an amplifier, it may be desirable for the amplifier to provide high amplification gains at high frequencies, such as frequencies at or above $f_{max}/3$, where $f_{max}$ is the maximum operation frequency of the active devices in the amplifier, for example the transistors.

An approach to increase the gain of amplifier 300 is to increase the bias voltage $V_{dd}$ as for example illustrated by diagram 400*a*. Referring to diagram 402*a*, various gain values of amplifier 300 at the operation frequency of 200 GHz when $V_{dd}$ is varied is illustrated. For example, when $V_{dd}$ is varied from 0.4V to 0.7V, the gain of amplifier 300 varies from approximately 1 dB to a maximum of approximately 17 dB. This means that a variation of approximately 200 mV in $V_{dd}$ produces a variation of 17 dB in the gain of the amplifier. Diagram 404*a* illustrates the power consumption of the amplifier 300 when the $V_{dd}$ is varied. In an example, at $V_{dd}$=0.6V where the maximum gain is achieved, the power consumption of the amplifier 300 is approximately 25 mW.

Referring now to FIG. 4B, various diagrams demonstrating various performance metrics of an amplifier 300 is provided in accordance with various embodiments of the present disclosure. In various embodiments, the control voltages on the body of the various transistors in the amplification stage units are varied to increase the amplification gain at high frequencies. In an example embodiment illustrated by FIG. 4B, the bias voltage $V_{dd}$ is kept approximately constant at 0.4V. In an example embodiment illustrated in diagram 400*b*, control voltages applied to the body of the transistors are equal ($V_b$=$V_{b1}$=$V_{b2}$=$V_{b3}$) and are varied from 0V to 3V. It is noted that in various embodiments, various control voltages may be varied independent of each other.

In accordance with an example embodiment of the present disclosure, diagram 402b illustrates various gain values of amplifier 300 at an operation frequency of 200 GHz when a voltage $V_b$, as applied equally to the body of all the transistors, is varied. For example, when $V_b$ is varied from 0V to 3V, the gain of amplifier 300 varies from approximately 1 dB to a maximum of approximately 16 dB. This means that a variation of approximately 2.2V in $V_b$ causes a variation of 16 dB in the gain of the amplifier. In various example embodiments, compared to when $V_{dd}$ is used to vary the gain of the amplifier, varying the control voltage on the body of the transistors provides more accuracy in determining gain because a variation in gain would be less sensitive to a variation in the control voltage.

In accordance with an example embodiment of the present disclosure, diagram 404b illustrates the power consumption of the amplifier 300 when $V_b$ is varied. In an example, at $V_b$=2.2V where the maximum gain is achieved, the power consumption of the amplifier 300 is approximately 13.5 mW, which is significantly reduced compared to when a variable $V_{dd}$ is used to provide maximum gain.

Therefore, in accordance with example embodiments of the present disclosure, using one or more control voltages of the one or more transistors to provide higher amplification gains at higher frequencies (for example between ⅓ $f_{max}$ to $f_{max}$ where $f_{max}$ is the maximum operation frequency of the active devices in the amplifier) provides various advantages. In various examples, variations in gain are less sensitive to the variation in the control voltage, therefore using the control voltage may provide a more accurate gain control. In various examples, using the one or more control voltages to determine gain may reduce the power consumption of the amplifier. In example embodiments of the present disclosure, by removing a need to directly provide power supply to each amplification stage unit, and/or by eliminating the requirement to incorporate DC blocking circuitries in matching circuits or feedback loops, the number of electrical components required and circuit size may be reduced.

By providing amplification gains at higher frequencies closer to $f_{max}$ and having various advantages in providing accuracy in gain control, lowering power consumption, and/or reducing circuit size or footprint, various embodiments presented herein may be used in various GHz frequency, mmWave frequency (>30 GHz), and THz frequency operations. For example, various embodiments presented herein may be used as amplifiers or variable gain amplifiers (VGA) in high frequency applications such as 5G or 6G wireless communications.

Figure 5:
FIG. 5 illustrates a routine 500 in accordance with various embodiments of the present disclosure.

Referring now to FIG. 5, with reference to FIG. 2, a schematic diagram illustrating a routine 500 is provided in accordance with various embodiments of the present disclosure. In block 502 routine 500 modulates, by a first transistor 222 of a first amplification stage unit 202, a first transistor threshold voltage using a first control voltage (e.g., $V_{b1}$) on a body of the first transistor 222. In block 504, routine 500 electrically couples, by a first direct current (DC) first DC permitting feedback loop 208, a drain of the first transistor 222 with a gate of the first transistor 222.

In block 506, routine 500 modulates, by a second transistor 224 of a second amplification stage unit 204, a second transistor threshold voltage using a second control voltage (e.g., $V_{b2}$) on a body of the second transistor 224. In block 508, routine 500 electrically couples, by a second DC permitting feedback loop 210, a drain of the second transistor 224 with a gate of the second transistor 224.

Referring now to FIG. 6, with reference to FIG. 2, a schematic diagram illustrating a routine 600 is provided in accordance with various embodiments of the present disclosure. In block 602, routine 600 electrically couples and matches, by a first DC permitting matching circuit 214, the first amplification stage unit 202 to the second amplification stage unit 204. In various embodiments, in block 604, routine 600 provides an amplifier DC bias voltage to the first amplification stage unit 202 and transmitting the amplifier DC bias voltage to the second amplification stage unit 204 using the first DC permitting matching circuit 214, or in block 608, routine 600 provides the amplifier DC bias voltage to the second amplification stage unit 204 and transmitting the amplifier DC bias voltage to the first amplification stage unit 202 using the first DC permitting matching circuit 214. In block 606, routine 600 provides functioning bias for both the first amplification stage unit 202 and the second amplification stage unit 204 using the amplifier DC bias voltage.

Referring now to FIG. 7, with reference to FIG. 2, a schematic diagram illustrating a routine 700 is provided in accordance with various embodiments of the present disclosure. In block 702, routine 700 electrically couples and matches, by a first DC permitting matching circuit 214, the first amplification stage unit 202 to the second amplification stage unit 204. In block 704, routine 700 controls the first control voltage independently from the second control voltage. In block 706, routine 700 controls at least one of the gain, linearity, and power consumption of the first amplification stage unit 202 using the first control voltage during the operation of the amplifier. In block 708, routine 700 controls at least one of the gain, linearity, and power consumption of the second amplification stage unit 204 using the second control voltage during the operation of the amplifier independent of the gain, linearity, and power consumption of the first amplification stage unit 202.

In block 710, routine 700 electrically couples and matches an input of the amplifier 200 to the first amplification stage unit 202 using input matching circuit 228. In block 712, routine 700 electrically couples and matches the $n^{th}$ amplification stage unit 206 to a load of the amplifier 200 using output matching circuit 220.

Referring now to FIG. 8, with reference to FIG. 2, a schematic diagram illustrating a routine 800 is provided in accordance with various embodiments of the present disclosure. In block 802, routine 800 controls at least one of the gain, linearity, and power consumption of the amplifier using any of the first control voltage or the second control voltage or any combination of the first control voltage and the second control voltage while an amplifier DC bias voltage remains approximately constant. In block 804, routine 800 varies any of the first control voltage or the second control voltage during an operation of the amplifier. In block 806, routine 800 determines a variable gain, linearity, or power consumption of the amplifier using the variable first control voltage or the variable second control voltage or a combination of the variable first control voltage or the variable second control voltage.

Referring now to FIG. 9, with reference to FIG. 2, a schematic diagram illustrating a routine 900 is provided in accordance with various embodiments of the present disclosure. In block 910, routine 900 modulates, by an $n^{th}$ transistor 226 of an $n^{th}$ amplification stage unit 206, an $n^{th}$ transistor threshold using an $n^{th}$ control voltage on a body of the $n^{th}$ transistor 226. N may be greater or equal to 3. In block 912, routine 900 electrically couples a drain of the $n^{th}$ transistor with a gate of the $n^{th}$ transistor. In block 914, routine 900 electrically couples and matches, by an $(n-1)^{th}$ DC permitting matching circuit 218, an (n−1)$^{th}$ amplification stage unit to the n$^{th}$ amplification stage unit.

Figure 10:
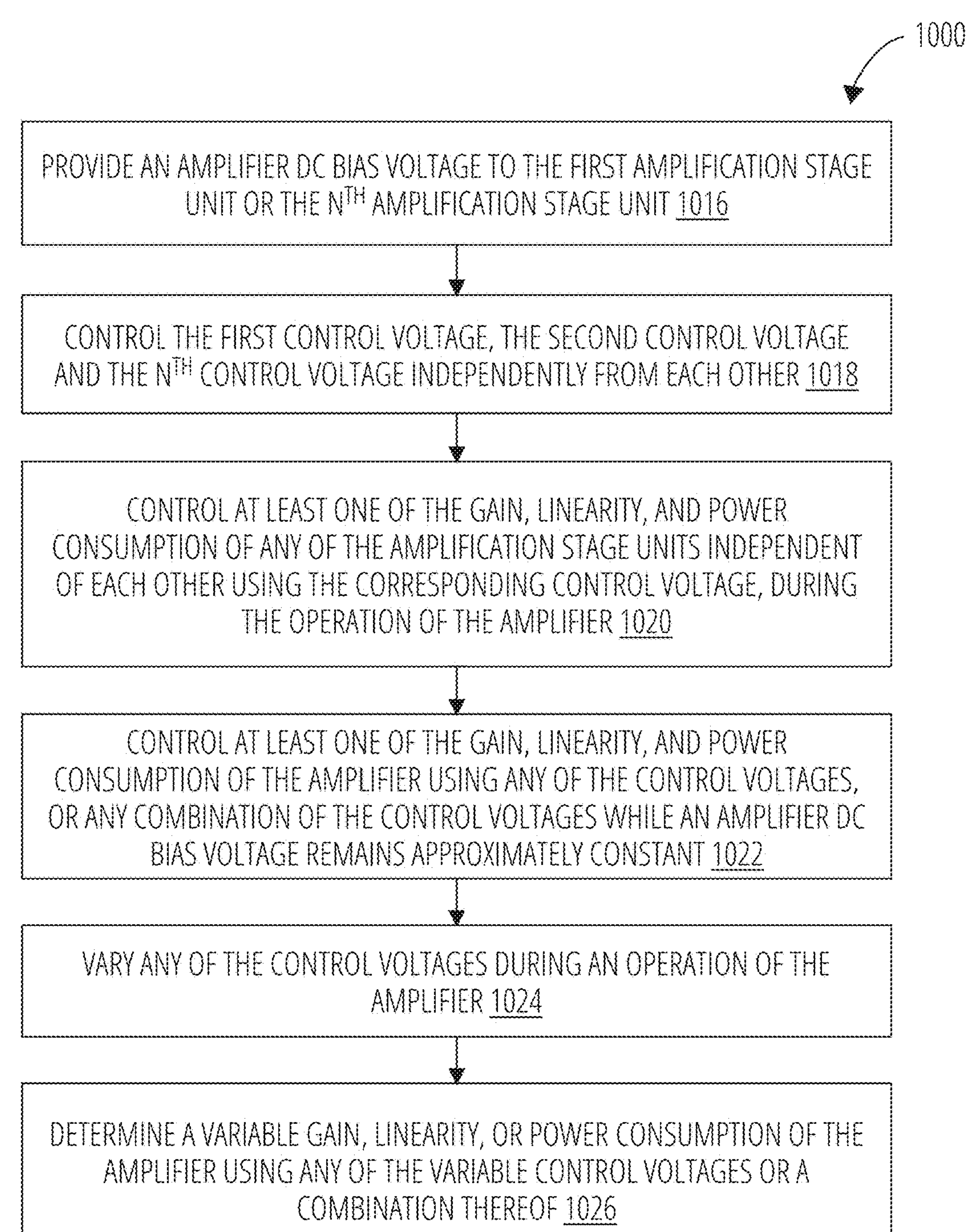
FIG. 10 illustrates a routine 1000 in accordance with various embodiments of the present disclosure.

Referring now to FIG. 10, with reference to FIG. 2, a schematic diagram illustrating a routine 1000 is provided in accordance with various embodiments of the present disclosure. In various embodiments, in block 1016, routine 1000 provides an amplifier DC bias voltage to the first amplification stage unit and transmits the amplifier DC bias voltage to the other amplification stage units using the DC permitting matching circuits. In various embodiments, in block 1016, routine 1000 provides an amplifier DC bias voltage to the n$^{th}$ amplification stage unit and transmits the amplifier DC bias voltage to the other amplification stage units using the DC permitting matching circuits. In various embodiments, the amplifier DC bias voltage provides functioning bias for any and/or all the amplification stage units of the amplifier.

In block 1018, routine 1000 controls the first control voltage, the second control voltage and the n$^{th}$ control voltage independently from each other. In block 1020, routine 1000 controls at least one of the gain, linearity, and power consumption of any of the amplification stage units independent of each other using the corresponding control voltage, during the operation of the amplifier. In block 1022, routine 1000 controls at least one of the gain, linearity, and power consumption of the amplifier using any of the control voltages, or any combination of the control voltages while an amplifier DC bias voltage remains approximately constant.

In block 1024, routine 1000 varies any of the control voltages during an operation of the amplifier. In block 1026, routine 1000 determines a variable gain, linearity, or power consumption of the amplifier using any of the variable control voltages or a combination thereof.

Many modifications and other embodiments of the disclosures set forth herein will come to mind to one skilled in the art to which these disclosures pertain having the benefit of teachings presented in the foregoing descriptions and the associated drawings. Although the figures only show certain components of the apparatus and systems described herein, it is understood that various other components may be used in conjunction with the system. Therefore, it is to be understood that the disclosures are not to be limited to the specific embodiments disclosed and that modifications and other embodiments are intended to be included within the scope of the appended claims. Moreover, the steps in the method described above may not necessarily occur in the order depicted in the accompanying diagrams, and in some cases one or more of the steps depicted may occur substantially simultaneously, or additional steps may be involved. Although specific terms are employed herein, they are used in a generic and descriptive sense only and not for purposes of limitation.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. The disclosed embodiments relate primarily to interleaved coupled inductors transformers, one skilled in the art may recognize that such principles may be applied to any transformer device. Alternative embodiments that result from combining, integrating, and/or omitting features of the embodiment(s) are also within the scope of the disclosure. Accordingly, the scope of protection is not limited by the description set out above.

Additionally, the section headings used herein are provided for consistency with the suggestions under 37 C.F.R. 1.77 or to otherwise provide organizational cues. These headings shall not limit or characterize the disclosure(s) set out in any claims that may issue from this disclosure.

Use of broader terms such as "comprises," "includes," and "having" should be understood to provide support for narrower terms such as "consisting of," "consisting essentially of," and "comprised substantially of" Use of the terms "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

What is claimed is:

1. An amplifier comprising:

a first amplification stage unit comprising:

a first transistor configured to modulate a first transistor threshold voltage using a first control voltage on a body of the first transistor; and a first direct current permitting feedback loop electrically coupling a drain of the first transistor with a gate of the first transistor; and a second amplification stage unit comprising:

a second transistor configured to modulate a second transistor threshold voltage using a second control voltage on a body of the second transistor; and a second direct current permitting feedback loop electrically coupling a drain of the second transistor with a gate of the second transistor; and a first direct current permitting matching circuit configured to electrically couple and match the first amplification stage unit to the second amplification stage unit, wherein at least one of a gain, linearity, and power consumption of the first or second amplification stage units is a function of the corresponding first or second transistor threshold voltage.

2. The amplifier of claim 1, configured to:

provide an amplifier bias voltage to the first amplification stage unit and transmit the amplifier bias voltage to the second amplification stage unit using the first direct current permitting matching circuit, or provide the amplifier bias voltage to the second amplification stage unit and transmit the amplifier bias voltage to the first amplification stage unit using the first direct current permitting matching circuit, wherein the amplifier bias voltage provides functioning bias for both the first amplification stage unit and the second amplification stage unit.

3. The amplifier of claim 1, wherein the first and second transistors are fully depleted silicon on insulator (FD-SOI) transistors.

4. The amplifier of claim 1, configured to control at least one of the gain, linearity, and power consumption of the first amplification stage unit using the first control voltage during the operation of the amplifier.

5. The amplifier of claim 4, configured to:

control the first control voltage independently from the second control voltage; and control at least one of the gain, linearity, and power consumption of the second amplification stage unit using the second control voltage during the operation of the amplifier independent of the gain, linearity, and power consumption of the first amplification stage unit.

6. The amplifier of claim 1, configured to control at least one of the gain, linearity, and power consumption of the amplifier using any of the first control voltage or the second control voltage or any combination of the first control voltage and the second control voltage while an amplifier bias voltage remains approximately constant.

7. The amplifier of claim 6, configured to:

vary any of the first control voltage or the second control voltage during an operation of the amplifier; and determine a variable gain, linearity, or power consumption of the amplifier using the variable first control voltage or the variable second control voltage or a combination of the variable first control voltage or the variable second control voltage.

8. The amplifier of claim 1, comprising:

at least a third amplification stage unit comprising:

a third transistor configured to modulate a third transistor threshold voltage using a third control voltage on a body of the third transistor; and a third direct current permitting feedback loop electrically coupling a drain of the third transistor with a gate of the third transistor;

a second direct current permitting matching circuit configured to electrically couple and match the first amplification stage unit to the second amplification stage unit.

9. The amplifier of claim 8, configured to:

provide an amplifier bias voltage to the first amplification stage unit and transmit the amplifier bias voltage to the second amplification stage unit using the first direct current permitting matching circuit and to the third amplification stage unit using the second direct current permitting matching circuit, or provide the amplifier bias voltage to the third amplification stage unit and transmit the amplifier bias voltage to the second amplification stage unit using the second direct current permitting matching circuit and to the first amplification stage unit using the first direct current permitting matching circuit, wherein the amplifier bias voltage provides functioning bias for the first amplification stage unit, the second amplification stage unit, and the third amplification stage unit.

10. The amplifier of claim 8, configured to:

control the first control voltage, the second control voltage and the third control voltage independently from each other;

control at least one of the gain, linearity, and power consumption of any of the first amplification stage unit, the second amplification stage unit, or the third amplification stage unit independent of each other using the corresponding first control voltage, second control voltage, or the third control voltage, during the operation of the amplifier; and control at least one of the gain, linearity, and power consumption of the amplifier using any of the first control voltage, the second control voltage, or the third control voltage, or any combination of the first control voltage, the second control voltage, or the third control voltage while an amplifier bias voltage remains approximately constant.

11. The amplifier of claim 8, configured to:

vary any of the first control voltage, the second control voltage, or the third control voltage during an operation of the amplifier; and determine a variable gain, linearity, or power consumption of the amplifier using the variable first control voltage, the variable second control voltage, the variable third control voltage or a combination thereof.

12. A method comprising:

modulating, by a first transistor of a first amplification stage unit, a first transistor threshold voltage using a first control voltage on a body of the first transistor;

electrically coupling, by a first direct current permitting feedback loop, a drain of the first transistor with a gate of the first transistor;

modulating, by a second transistor of a second amplification stage unit, a second transistor threshold voltage using a second control voltage on a body of the second transistor;

electrically coupling, by a second direct current permitting feedback loop, a drain of the second transistor with a gate of the second transistor; and electrically coupling and matching, by a first direct current permitting matching circuit, the first amplification stage unit to the second amplification stage unit.

13. The method of claim 12, comprising:

providing an amplifier bias voltage to the first amplification stage unit and transmitting the amplifier bias voltage to the second amplification stage unit using the first direct current permitting matching circuit, or providing the amplifier bias voltage to the second amplification stage unit and transmitting the amplifier bias voltage to the first amplification stage unit using the first direct current permitting matching circuit, wherein the amplifier bias voltage provides functioning bias for both the first amplification stage unit and the second amplification stage unit.

14. The method of claim 12, comprising:

controlling the first control voltage independently from the second control voltage;

controlling at least one of the gain, linearity, and power consumption of the first amplification stage unit using the first control voltage during the operation of the amplifier; and controlling at least one of the gain, linearity, and power consumption of the second amplification stage unit using the second control voltage during the operation of the amplifier independent of the gain, linearity, and power consumption of the first amplification stage unit.

15. The method of claim 12, comprising controlling at least one of the gain, linearity, and power consumption of the amplifier using any of the first control voltage or the second control voltage or any combination of the first control voltage and the second control voltage while an amplifier bias voltage remains approximately constant.

16. The method of claim 15, comprising:

varying any of the first control voltage or the second control voltage during an operation of the amplifier; and determining a variable gain, linearity, or power consumption of the amplifier using the variable first control voltage or the variable second control voltage or a combination of the variable first control voltage or the variable second control voltage.

17. The method of claim 12, comprising:

modulating, by a third transistor of a third amplification stage unit, a third transistor threshold voltage using a third control voltage on a body of the third transistor;

electrically coupling a drain of the third transistor with a gate of the third transistor; and electrically coupling and matching, by a second direct current permitting matching circuit, the first amplification stage unit to the second amplification stage unit.

18. The method of claim 17, comprising:

providing an amplifier bias voltage to the first amplification stage unit and transmit the amplifier bias voltage to the second amplification stage unit using the first direct current permitting matching circuit and to the third amplification stage unit using the second direct current permitting matching circuit, or providing the amplifier bias voltage to the third amplification stage unit and transmit the amplifier bias voltage to the second amplification stage unit using the second direct current permitting matching circuit and to the first amplification stage unit using the first direct current permitting matching circuit, wherein the amplifier bias voltage provides functioning bias for the first amplification stage unit, the second amplification stage unit, and the third amplification stage unit;

controlling the first control voltage, the second control voltage and the third control voltage independently from each other;

controlling at least one of the gain, linearity, and power consumption of any of the first amplification stage unit, the second amplification stage unit, or the third amplification stage unit independent of each other using the corresponding first control voltage, second control voltage, or the third control voltage, during the operation of the amplifier;

controlling at least one of the gain, linearity, and power consumption of the amplifier using any of the first control voltage, the second control voltage, or the third control voltage, or any combination of the first control voltage, the second control voltage, or the third control voltage while an amplifier bias voltage remains approximately constant;

varying any of the first control voltage, the second control voltage, or the third control voltage during an operation of the amplifier; and determining a variable gain, linearity, or power consumption of the amplifier using the variable first control voltage, the variable second control voltage, the variable third control voltage or a combination thereof.

* * * * *